(12) United States Patent
Park et al.

(10) Patent No.: US 9,109,147 B2
(45) Date of Patent: Aug. 18, 2015

(54) ADHESIVE COMPOSITION FOR SEMICONDUCTOR AND ADHESIVE FILM COMPRISING THE SAME

(71) Applicants: Baek Soung Park, Uiwang-si (KR); Ki Tae Song, Uiwang-si (KR); Dong Seon Uh, Uiwang-si (KR); In Hwan Kim, Uiwang-si (KR)

(72) Inventors: Baek Soung Park, Uiwang-si (KR); Ki Tae Song, Uiwang-si (KR); Dong Seon Uh, Uiwang-si (KR); In Hwan Kim, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/924,877

(22) Filed: Jun. 24, 2013

(65) Prior Publication Data
US 2013/0281559 A1    Oct. 24, 2013

Related U.S. Application Data

(63) Continuation of application No. PCT/KR2011/009301, filed on Dec. 2, 2011.

(30) Foreign Application Priority Data

Dec. 27, 2010 (KR) .................. 10-2010-0136069
Dec. 29, 2010 (KR) .................. 10-2010-0138351

(51) Int. Cl.
| | | |
|---|---|---|
| *C09J 163/00* | (2006.01) | |
| *H01L 23/00* | (2006.01) | |
| *C09J 7/00* | (2006.01) | |
| *C08L 63/00* | (2006.01) | |
| *H01L 25/065* | (2006.01) | |
| *H01L 25/00* | (2006.01) | |

(52) U.S. Cl.
CPC ........ *C09J 163/00* (2013.01); *C09J 7/00* (2013.01); *H01L 24/29* (2013.01); *H01L 24/73* (2013.01); *H01L 24/83* (2013.01); *C08L 63/00* (2013.01); *H01L 24/27* (2013.01); *H01L 24/48* (2013.01); *H01L 24/94* (2013.01); *H01L 25/0657* (2013.01); *H01L 25/50* (2013.01); *H01L 2224/27436* (2013.01); *H01L 2224/2929* (2013.01); *H01L 2224/29339* (2013.01); *H01L 2224/29344* (2013.01); *H01L 2224/29347* (2013.01); *H01L 2224/29386* (2013.01); *H01L 2224/32145* (2013.01); *H01L 2224/32225* (2013.01); *H01L 2224/48145* (2013.01); *H01L 2224/73215* (2013.01); *H01L 2224/83191* (2013.01); *H01L 2224/83862* (2013.01); *H01L 2224/92165* (2013.01); *H01L 2224/94* (2013.01); *H01L 2225/06506* (2013.01); *H01L 2924/00014* (2013.01)

(58) Field of Classification Search
USPC ............ 521/135; 523/400, 434; 428/220, 414
See application file for complete search history.

(56) References Cited

U.S. PATENT DOCUMENTS

2010/0270664 A1    10/2010    Lee et al.

FOREIGN PATENT DOCUMENTS

| | | | |
|---|---|---|---|
| CN | 101426875 A | 5/2009 | |
| JP | 11-140406 A | 5/1999 | |
| KR | 10-2008-0113670 A | 12/2008 | |
| KR | 10-2010-0077792 A | 7/2010 | |
| KR | 1020100077792 A | * 7/2010 | ............ C09J 163/00 |
| TW | 200940638 A | 10/2009 | |
| WO | WO 2006/107792 A1 | 10/2006 | |

OTHER PUBLICATIONS

Taiwanese Office Action dated Nov. 7, 2013.
PCT/KR2011/009301 International Search Report dated Jul. 18, 2012.
Korean Office Action dated Jun. 13, 2013.
Office Action mailed Dec. 18, 2014 in corresponding Chinese Patent Application No. 201180063146.5.

* cited by examiner

*Primary Examiner* — Robert Harlan
(74) *Attorney, Agent, or Firm* — Lee & Morse, P.C.

(57) ABSTRACT

An adhesive composition for a semiconductor has two exothermic peaks between 65° C. and 350° C. and has an area ratio of voids of less than 10%, measured after curing at 150° C. for 10 minutes and then at 150° C. for 30 minutes, and then molding at 175° C. for 60 seconds. A first exothermic peak appears between 65° C. and 185° C. and a second exothermic peak appears between 155° C. and 350° C.

18 Claims, 1 Drawing Sheet

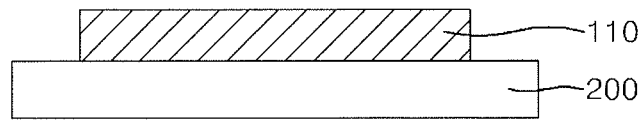

ADHESIVE COMPOSITION FOR SEMICONDUCTOR AND ADHESIVE FILM COMPRISING THE SAME

CROSS-REFERENCE TO RELATED APPLICATION

Korean Patent Application No. 10-2010-0136069, filed on Dec. 27, 2010 and Korean Patent Application No. 10-2010-0138351, filed on Dec. 29, 2010, in the Korean Intellectual Property Office, each entitled: "Adhesive Composition for Semiconductor and Adhesive Film Comprising the Same," are incorporated by reference herein in their entirety.

This application is a continuation of pending International Application No. PCT/KR2011/009301, entitled "Adhesive Composition for Semiconductor and Adhesive Film Comprising the Same," which was filed on Dec. 2, 2011, the entire contents of which are hereby incorporated by reference.

BACKGROUND

1. Field

Embodiments relate to an adhesive composition for a semiconductor and an adhesive film comprising the same.

2. Description of the Related Art

To realize a semiconductor device having a high capacity, a qualitative high-integration method of increasing the number of cells per unit area and a quantitative packaging method of depositing a plurality of chips to increase capacity are used.

As a packaging method, multi-chip packaging (MCP) is generally used, in which a plurality of chips are deposited using adhesives and upper and lower chips are electrically connected to each other using wire bonding.

SUMMARY

Embodiments are directed to an adhesive composition for a semiconductor, the adhesive composition having two exothermic peaks between 65° C. and 350° C. and having an area ratio of voids (Vm) of less than 10%, measured after 1-cycle curing at 150° C. for 30 minutes and then molding at 175° C. for 60 seconds. A first exothermic peak appears between 65° C. and 185° C. and a second exothermic peak appears between 15° C. 5 and 350° C. with the proviso that the second exothermic peak appears at a higher temperature than the first exothermic peak.

The adhesive composition may include a thermoplastic resin, an epoxy resin, a curing agent; and a curing accelerator.

The curing agent may include two different kinds of curing agents each having a different reaction temperature range.

The curing agent may include a phenolic curing agent and an amine curing agent.

A weight ratio of the thermoplastic resin to a mixture of the epoxy resin, the phenolic curing agent, and the amine curing agent as a curing system may be 25~65 wt %: 35~75 wt %.

The phenolic curing agent may include a biphenyl group in a main chain.

The phenolic curing agent may be represented by Formula 1:

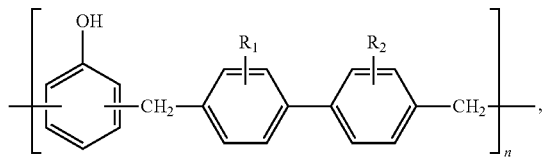

where $R_1$ and $R_2$ in Formula 1 each independently represent a C1 to C6 alkyl group, and n is from 2 to 100.

The amine curing agent may be represented by Formula 2:

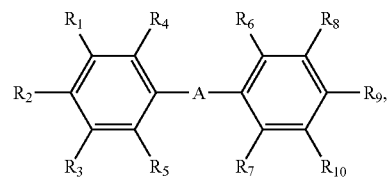

where A in Formula 2 is a single bond or represents one selected from the group consisting of —$CH_2$—, —$CH_2CH_2$—, —$SO_2$—, —NHCO—, —$C(CH_3)_2$—, and —O—, and $R_1$, $R_2$, $R_3$, $R_4$, $R_5$, $R_6$, $R_7$, $R_8$, $R_9$ and $R_{10}$ in Formula 2 each independently represent hydrogen, a C1 to C4 alkyl group, a C1 to C4 alkoxy group, or an amine group; here, at least two of $R_1$, $R_2$, $R_3$, $R_4$, $R_5$, $R_6$, $R_7$, $R_8$, $R_9$ and $R_{10}$ in Formula 2 include amine groups.

A ratio of the phenolic curing agent to the amine curing agent may be 3:1 to 1:11.

The curing accelerator may have a melting point of 100° C. to 160° C.

The curing accelerator may include at least one of a melamine catalyst, an imidazole catalyst, and a phosphorus catalyst.

The thermoplastic resin may be included in an amount of 30 to 70 wt %, in terms of solid content, of the entire composition.

The adhesive composition may include 15 to 70 wt % of the thermoplastic resin, 5 to 35 wt % of the epoxy resin, 0.5 to 15 wt % of a phenolic curing agent, 1 to 15 wt % of an amine curing agent, 0.01 to 10 wt % of the curing accelerator, 0 to 5 wt % of a silane coupling agent, and 10 to 60 wt % of fillers.

An amount of the thermoplastic resin may be greater than a total amount of the epoxy resin and the curing agent. The curing agent may include a phenolic curing agent and an amine curing agent. A ratio of the phenolic curing agent to the amine curing agent may be 1:1 to 1:5.

An amount of the thermoplastic resin may be less than a total amount of the epoxy resin and the curing agent. The curing agent may include a phenolic curing agent and an amine curing agent. A ratio between a phenolic curing agent and an amine curing agent may be 1:1 to 1:5.

The adhesive composition may have an area ratio of voids Vc of less than 15% after 1-cycle curing at 150° C. for 30 minutes.

An adhesive film for a semiconductor may include the adhesive composition. A semiconductor device may include the adhesive film.

Embodiments are also directed to an adhesive composition for a semiconductor, having a compressive strength of 100 to 1,500 gf/mm² at 150° C. after curing at 125° C. for 30 minutes and an area ratio of voids (Vm) on an adherend of less than 10% after 1-cycle curing at 150° C. for 30 minutes and then EMC molding at 175° C. for 60 seconds. The adhesive composition may have an area ratio of voids Vc of less than 15% after 1-cycle curing at 150° C. for 30 minutes. The adhesive composition may have a compressive strength of 500 to 1,000 gf/mm². An adhesive film for a semiconductor may include the adhesive composition described above. A semiconductor device may include the adhesive film.

Embodiments are also directed to an adhesive composition for a semiconductor, having a compressive strength of 100 to 1,500 gf/mm² at 150° C. after curing at 125° C. for 30 minutes and an area ratio of voids (Vc) on an adherend of less than 15% after 1-cycle curing at 150° C. for 30 minutes. The adhesive composition has a compressive strength of 500 to 1,000 gf/mm². An adhesive film for a semiconductor may include adhesive composition. A semiconductor device may include the adhesive film.

BRIEF DESCRIPTION OF DRAWING

Features will become apparent to those of skill in the art by describing in detail exemplary embodiments with reference to the attached drawing in which:

FIG. 1 illustrates a sectional view of semiconductor device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

Herein, the content of each component will be described in terms of solid content unless stated otherwise.

Herein, the term "exothermic range," used with respect to an adhesive composition, denotes a temperature range in which an adhesive composition emits greater than 10 J/g heat at a temperature rise rate of 10° C./min using differential scanning calorimetry (DSC). Herein, the term "exothermic peak" refers to a spot at which the adhesive composition emits the greatest amount of energy in the exothermic range.

An adhesive composition for a semiconductor according to an embodiment has two exothermic peaks between 65° C. to 350° C., wherein a first exothermic peak appears between 65° C. and 185° C. and a second exothermic peak appears between 155° C. and 350° C. According to an implementation, the first exothermic peak may appear at 65° C. to 155° C. and the second exothermic peak may appear between 155° C. and 350° C. According to an implementation, the first exothermic peak may appear between 90° C. and 165° C. and the second exothermic peak appears between 165° C. and 350° C. According to an implementation, the first exothermic peak may appear between 120° C. and 185° C. and the second exothermic peak may appear between 185° C. and 350° C. The second exothermic peak may appear at a higher temperature than the first exothermic.

As such, the adhesive composition for the semiconductor according to this embodiment has two separated cure periods according to DSC, thereby shortening or omitting allowing a semi-curing process that may be conducted after bonding the same kind of chips to be shortened or omitted. Generally, when a semi-curing process subsequent to bonding the same kind of chips is shortened or omitted, voids are generated due to high fluidity in wire bonding. According to the present embodiment, however, two different kinds of curing agents and a catalyst may be used to remarkably reduce voids and the semi-curing process may be shortened or omitted.

In one implementation, the adhesive composition for the semiconductor may have a compressive strength of 100 to 1,500 gf/mm² at 150° C. after curing at 125° C. for 30 minutes. The term "compressive strength" refers to strength at a pressed distance of 0.05 mm after the adhesive composition is formed into a laminate having a thickness of 400 μm, which is cured at 125° C. for 30 minutes and pressed at 150° C. and 0.1 mm/sec using an Advanced Rheometric Expansion System (ARES) rheometer. Specifically, the adhesive composition may have a compressive strength of 500 to 1,000 gf/mm². A high compressive strength may contribute to securing initial reliability in wire bonding and smoothly eliminating voids in EMC molding. (The term "EMC" refers to "epoxy molding compound.")

In measuring the compressive strength, curing at 125° C. for 30 minutes corresponds to curing at 150° C. for 10 minutes.

Herein, the term "1-cycle curing" refers to a process in which a substrate/adhesive layer/substrate sample is placed on a hot plate and the adhesive layer is cured at 150° C. for 30 minutes. 150° C. and 30 minutes are desired temperature and time for wire bonding after chip bonding. In wire bonding, chips are not allowed to move appreciably or to be bent. A void generated in this process is defined as a "void after 1 cycle" (hereinafter, "Vc"). A ratio of voids (Vc) is obtained by numerically expressing the area of voids with respect to a measured area through image analysis of the adhesive layer cured under the above conditions, taken by a microscope (magnification: ×25) ((Vc area ratio=Void area/Total area× 100). When an area ratio of voids (Vc) is less than 15%, excellent reliability may be obtained.

The adhesive composition for the semiconductor may have an area ratio of voids (Vc) of less than 15%, or, for example less than 10%. For example, the area ratio of Vc may be 0 to 5%.

Two types of samples may be manufactured as follows.

A substrate/adhesive layer/substrate sample may be prepared by forming an adhesive film according to the present embodiment to a thickness of 50 to 60 m, followed by lamination between two 10 mm×10 mm glass slides at 60° C.

Alternatively, a PCB (or wafer)/adhesive layer/chip sample may be prepared by placing a ground wafer on a mounter hot plate, eliminating impurities with isopropyl alcohol (IPA), and mounting a prepared adhesive film on a mirror side of the wafer. Here, a mounter setting temperature is an actual surface temperature of 60° C. The adhesive film and the wafer, which are mounted, are sawed into 10 mm×10 mm chips, and the chips having the adhesive formed on one side thereof (adhesive+chip) are attached at 120° C. and 1 kgf/sec to a printed circuit board (PCB), and preliminarily treated under the conditions shown in the following table:

PCB: 62 mm one shot PCB
PCB baking: in oven at 120° C. for 1 hour
Plasma treatment after baking After 1-cycle curing and then EMC molding at 175° C. for 60 seconds, voids may be generated between the PCB (or chips) and the adhesive layer. Here, a void generated in this process is defined as a "void after molding (hereinafter, Vm)." The void (Vm) is measured after curing and molding under the above conditions. The sample is separated into individual units using a singulation saw, the PCB is removed in order to measure Vm, and grinding is conducted using a grinder to expose the adhesive layer of the adhesive film. The grinding is carried out only until a solder resist (SR) layer of the PCB slightly remains to be semi-transparent in order to ease observation of voids.

After grinding, an image of the exposed adhesive layer is taken by a microscope (magnification: ×25) and analyzed to examine whether voids exist and to express Vm numerically. To numerically express voids, the total area is divided into 10×10 sections, and sections having a void are counted and expressed as a percent (Vm area ratio=Void area/Total area× 100). When an area ratio of Vm is less than 10%, the adhesive composition is determined as having voids eliminated. When an area ratio of Vm is 10% or more, the adhesive composition is determined as not having voids eliminated. When the area ratio of Vm is less than 10%, excellent reliability may be obtained and die creeping may not occur.

The adhesive composition for the semiconductor may include a thermoplastic resin, an epoxy resin, and a curing agent.

Thermoplastic Resin

Examples of the thermoplastic resin may include, for example, a polyimide resin, a polystyrene resin, a polyethylene resin, a polyester resin, a polyamide resin, a butadiene rubber, an acrylic rubber, a (meth)acrylate resin, a urethane resin, a polyphenylene ether resin, a polyether imide resin, a phenoxy resin, a polycarbonate resin, a polyphenylene ether resin, a modified polyphenylene ether resin, or mixtures thereof. For example, the thermoplastic resin may include an epoxy group. In an implementation, an epoxy group containing (meth)acrylic copolymer may be used.

The thermoplastic resin may have a glass transition temperature of −30 to 80° C., or, for example 5 to 60° C., or, for example, 5 to 35° C. Within this range, high fluidity may be secured to obtain excellent void elimination performance and adhesion and reliability may be exhibited.

In an implementation, the thermoplastic resin may have a weight average molecular weight of 50,000 to 5,000,000 g/mol.

In an implementation, the thermoplastic resin may be present in an amount of 15 to 70 wt %, or, for example, 25 to 65 wt %, or, for example, 32 to 60 wt % based on the total amount of the composition in terms of solid content.

A weight ratio of the thermoplastic resin (A) to a mixture of the epoxy resin (B), a phenolic curing agent (C), and an amine curing agent (D) as a curing system ((A):(B)+(C)+(D)) may be 25 to 65 wt %:35 to 75 wt %. Within this range, voids after 1 cycle (Vc) and voids after molding (Vm) may be considerably less generated. For example, the ratio of (A):(B)+(C)+ (D) may be 30 to 60 wt %:40 to 70 wt %.

Epoxy Resin

The epoxy resin may perform curing and adhering functions. The epoxy resin may include a liquid epoxy resin, a solid epoxy resin, or mixtures thereof.

Examples of the liquid epoxy resin may include, for example, bisphenol A liquid epoxy resins, bisphenol F liquid epoxy resins, tri- or more functional liquid epoxy resins, rubber modified liquid epoxy resins, urethane modified liquid epoxy resins, acrylic-modified liquid epoxy resins, or photosensitive liquid epoxy resins. These may be used alone or in combination thereof. As an example, bisphenol A liquid epoxy resins may be used.

The liquid epoxy resin may have an epoxy equivalent weight of about 100 to about 1,500 g/eq, or, for example, about 150 to about 800 g/eq, or, for example about 150 to about 400 g/eq. Within this range, the cured product may exhibit excellent adhesion, maintain a glass transition temperature, and have excellent heat resistance.

The liquid epoxy resin may have a weight average molecular weight of about 100 to 1,000 g/mol. Within this range, the resin may exhibit excellent fluidity.

The solid epoxy resin may include a suitable epoxy resin that has a solid phase or near solid phase at room temperature and has at least one functional group. For example, an epoxy resin having a softening point (SP) of 30 to 100° C. may be used. Examples of the solid epoxy resin may include bisphenol epoxy resins, phenol novolac epoxy resins, o-cresol novolac epoxy resins, multifunctional epoxy resins, amine epoxy resins, heterocyclic ring-containing epoxy resins, substituted epoxy resins, naphthol epoxy resins, biphenyl epoxy resins, or derivatives thereof.

Commercially available products of the solid epoxy resin include the following. Examples of bisphenol epoxy resins include: YD-017H, YD-020, YD020-L, YD-014, YD-014ER, YD-013K, YD-019K, YD-019, YD-017R, YD-017, YD-012, YD-011H, YD-011S, YD-011, YDF-2004, YDF-2001, (Kukdo Chemical Co., Ltd.), etc. Examples of phenol novolac epoxy resins include: EPIKOTE 152 and EPIKOTE 154 (Yuka Shell Epoxy Co., Ltd.); EPPN-201 (Nippon Kayaku Co., Ltd.); DN-483 (Dow Chemical Company); YDPN-641, YDPN-638A80, YDPN-638, YDPN-637, YDPN-644, YDPN-631 (Kukdo Chemical Co., Ltd.), etc. Examples of o-cresol novolac epoxy resins include: YDCN-500-1P, YDCN-500-2P, YDCN-500-4P, YDCN-500-5P, YDCN-500-7P, YDCN-500-8P, YDCN-500-10P, YDCN-500-80P, YDCN-500-80PCA60, YDCN-500-80PBC60, YDCN-500-90P, YDCN-500-90PA75 (Kukdo Chemical Co., Ltd.); EOCN-102S, EOCN-103S, EOCN-104S, EOCN-1012, EOCN-1025, EOCN-1027 (Nippon Kayaku Co., Ltd.); YDCN-701, YDCN-702, YDCN-703, YDCN-704 (Tohto Kagaku Co., Ltd.); Epiclon N-665-EXP (Dainippon Ink and Chemicals, Inc.), etc. Examples of bisphenol novolac epoxy resins include KBPN-110, KBPN-120, KBPN-115 (Kukdo Chemical Co., Ltd.), etc. Examples of multifunctional epoxy resins include: Epon 1031S (Yuka Shell Epoxy Co., Ltd.); Araldite 0163 (Ciba Specialty Chemicals); Detachol EX-611, Detachol EX-614, Detachol EX-614B, Detachol EX-622, Detachol EX-512, Detachol EX-521, Detachol EX-421, Detachol EX-411, Detachol EX-321 (NAGA Celsius Temperature Kasei Co., Ltd.); EP-5200R, KD-1012, EP-5100R, KD-1011, KDT-4400A70, KDT-4400, YH-434L, YH-434, YH-300 (Kukdo Chemical Co., Ltd.), etc. Examples of amine epoxy resins include: EPIKOTE 604 (Yuka Shell Epoxy Co., Ltd.); YH-434 (Tohto Kagaku Co., Ltd.); TETRAD-X and TETRAD-C (Mitsubishi Gas Chemical Company Inc.); ELM-120 (Sumitomo Chemical Industry Co., Ltd.), etc. Examples of heterocyclic epoxy resins include PT-810 (Ciba Specialty Chemicals). Examples of substituted epoxy resins include: ERL-4234, ERL-4299, ERL-4221, ERL-4206 (UCC Co., Ltd.), etc. Examples of naphthol epoxy resins include: Epiclon HP-4032, Epiclon HP-4032D, Epiclon HP-4700, and Epiclon HP-4701 (Dainippon Ink and Chemicals, Inc.). Examples of biphenyl epoxy resins include: YX-4000H (Japan Epoxy Resin Co., Ltd.); YSLV-120TE, GK-3207 (Nippon Steel Chemical Co., Ltd.); and NC-3000 (Nippon Kayaku Co., Ltd.). These epoxy resins may be used alone or as mixtures.

The epoxy resin may be present in an amount of about 5 to 35 wt %, or, for example, about 12 to 25 wt % with respect to the total amount of the adhesive composition in terms of solid content. Within this range, it may be possible to provide excellent reliability and mechanical properties and to obtain void (Vm) elimination effects.

Curing Agent

As the curing agent, two different kinds of curing agents having different reaction temperature ranges may be used.

In one implementation, the curing agent may include a phenolic curing agent and an amine curing agent in combination.

As the phenolic curing agent, a phenolic epoxy curing agent may be used. A suitable phenolic epoxy curing agent that can adjust the curing rate may be used, for example, xyloc curing agents; bisphenol resins containing at least two phenolic hydroxyl groups and having high resistance to electrolytic corrosion upon moisture absorption, such as bisphenol A, bisphenol F, and bisphenol S resins; phenol novolac resins; bisphenol A novolac resins; cresol novolac resins; or biphenyl resins.

For example, the phenolic curing agent may include a biphenyl group in the main chain. As an example, the phenolic curing agent may have a structure represented by Formula 1:

[Formula 1]

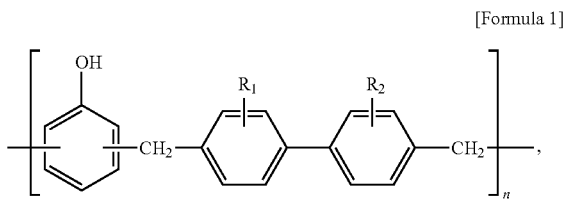

where $R_1$ and $R_2$ in Formula 1 each independently represent a C1 to C6 alkyl group, and n is from 2 to 100.

Examples of commercially available phenolic epoxy curing agents may include: simple phenolic curing agents, such as H-1, H-4, HF-1M, HF-3M, HF-4M, or HF-45 (Meiwa Plastic Industries Co., Ltd.); para-xylene resins, such as MEH-78004S, MEF-7800SS, MEH-7800S, MEH-7800M, MEH-7800H, MEH-7800HH, MEH-78003H (Meiwa Plastic Industries Co., Ltd.) or KPH-F3065 (KOLON Chemical Co., Ltd.); biphenyl resins, such as MEH-7851SS, MEH-7851S, MEH-7851M, MEH-7851H, MEH-78513H, MEH-78514H (Meiwa Plastic Industries Co., Ltd.) or KPH-F4500 (KOLON Chemical Co., Ltd.); and triphenylmethyl resins, such as MEH-7500, MEH-75003S, MEH-7500SS, MEH-7500S, or MEH-7500H (Meiwa Plastic Industries Co., Ltd.). These curing agents may be used alone or as mixtures.

The phenolic curing agent may be present in an amount of about 0.5 to 15 wt % based on the total amount of the adhesive composition in terms of solid content. Within this range, reliability and tensile strength of a film and void (Vc) decrease effects may be obtained. For example, the amount of the phenolic curing agent may be 0.5 to 14 wt %, or, for example, about 1 to 10 wt %. Within this range, void (Vc) decrease effects may be obtained.

As the amine curing agent, aromatic diamines may be used. For example, the amine curing agent may have a structure represented by Formula 2:

[Formula 2]

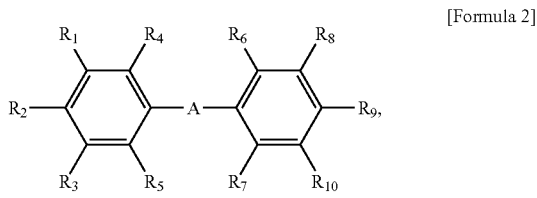

where A in Formula 2 has a single bond or represents one selected from the group consisting of —$CH_2$—, —$CH_2CH_2$—, —$SO_2$—, —NHCO—, —$C(CH_3)_2$—, and —O—, $R_1$, $R_2$, $R_3$, $R_4$, $R_5$, $R_6$, $R_7$, $R_8$, $R_9$ and $R_{10}$ in Formula 2 each independently represent hydrogen, a C1 to C4 alkyl group, a C1 to C4 alkoxy group, or an amine group. Here, at least two of $R_1$, $R_2$, $R_3$, $R_4$, $R_5$, $R_6$, $R_7$, $R_8$, $R_9$ and $R_{10}$ in Formula 2 include amine groups.

Examples of the amine curing agent may include 3,3'-diaminobenzidine, 4,4'-diaminodiphenylmethane, 4,4'- or 3,3'-diaminodiphenylsulfone, 4,4'-diaminobenzophenone, para-phenylenediamine, meta-phenylenediamine, meta-toluenediamine, 4,4'-diaminodiphenylether, 4,4'- or 3,3'-diaminobenzophenone, 1,4'- or 1,3'-bis(4- or 3-aminocumyl)benzene, 1,4'-bis(4- or 3-aminophenoxy)benzene, 2,2'-bis[4-(4- or 3-aminophenoxy)phenyl]propane, bis[4-(4- or 3-aminophenoxy)phenyl]sulfone, 2,2'-bis[4-(4- or 3-aminophenoxy)phenyl]hexafluorosulfone, 2,2'-bis[4-(4- or 3-aminophenoxy)phenyl]hexafluoropropane, 4,4'-diamino-3,3',5,5'-tetraebutyldiphenyl ketone, 4,4'-diamino-3,3',5,5'-tetraethyldiphenyl ketone, 4,4'-di-amino-3,3',5,5'-tetra-n-propyldiphenyl ketone, 4,4'-diamino-3,3',5,5'-tetraisopropyldiphenyl ketone, 4,4'-diamino-3,3',5,5'-tetramethyldiphenyl ketone, 4,4'-diamino-3,3',5,5'-tetra-n-propyldiphenylmethane, 4,4'-diamino-3,3',5,5'-tetramethyldiphenylmethane, 4,4'-diamino-3,3',5,5'-tetraisopropyldiphenylmethane, 4,4'-diamino-3,3',5,5'-tetraethyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diethyldiphenylmethane, 4,4'-diamino-3,5'-dimethyl-3',5'-diethyldiphenylmethane, 4,4'-diamino-3,5-dimethyl-3',5'-diisopropyldiphenylmethane, 4,4'-diamino-3,5-diethyl-3',5'-dibutyldiphenylmethane, 4,4'-diamino-3,5-diisopropyl-3',5'-dibutyldiphenylmethane, 4,4'-diamino-3,3'-diisopropyl-5,5'-dibutyldiphenylmethane, 4,4'-diamino-3,3'-dimethyl-5',5'-dibutyldiphenylmethane, 4,4'-diamino-3,3'-diethyl-5',5'-dibutyldiphenylmethane, 4,4'-diamino-3,3'-dimethyldiphenylmethane, 4,4'-diamino-3,3'-diethyldiphenylmethane, 4,4'-diamino-3,3'-di-n-propyldiphenylmethane, 4,4'-diamino-3,3'-diisopropyldiphenylmethane, 4,4'-diamino-3,3'-dibutyldiphenylmethane, 4,4'-diamino-3,3'-trimethyldiphenylmethane, 4,4'-diamino-3,3',5-triethyldiphenylmethane, 4,4'-diamino-3,3',5-tri-n-propyldiphenylmethane, 4,4'-diamino-3,3',5-triisopropyldiphenylmethane, 4,4'-diamino-3,3',5-tributyldiphenylmethane, 4,4'-diamino-3-methyl-3'-ethyldiphenylmethane, 4,4'-diamino-3-methyl-3'-isopropyldiphenylmethane, 4,4'-diamino-3-methyl-3'-butyldiphenylmethane, 4,4'-diamino-3-isopropyl-3'-butyldiphenylmethane, 2,2-bis(4-amino-3,5-dimethylphenyl)propane, 2,2-bis(4-amino-3,5-diethylphenyl)propane, 2,2-bis(4-amino-3,5-di-n-propylphenyl)propane, 2,2-bis(4-amino-3,5-diisopropylphenyl)propane, 2,2-bis(4-amino-3,5-dibutylphenyl)propane, 4,4'-diamino-3,3',5,5'-tetramethyldiphenylbenzanilide, 4,4'-diamino-3,3',5,5'-tetraethyldiphenylbenzanilide, 4,4'-diamino-3,3',5,5'-tetra-n-propyldiphenylbenzanilide, 4,4'-diamino-3,3',5,5'-tetraisopropyldiphenylbenzanilide, 4,4'-diamino-3,3',5,5'-tetrabutyldiphenylbenzanilide, 4,4'-diamino-3,3',5,5'-tetramethyldiphenylsulfone, 4,4'-diamino-3,3',5,5'-tetraethyldiphenylsulfone, 4,4'-diamino-3,3',5,5'-tetra-n-propyldiphenylsulfone, 4,4'-diamino-3,3',5,5'-tetraisopropyldiphenylsulfone, 4,4'-diamino-3,3',5,5'-tetramethyldiphenylether, 4,4'-diamino-3,3',5,5'- tetraethyldiphenylether, 4,4'-diamino-3,3',5,5'-tetra-n-propyldiphenylether, 4,4'-diamino-3,3',5,5'-tetraisopropyldiphenylether, 4,4'-diamino-3,3',5,5'-tetrabutyldiphenylether, 3,3'-diaminobenzophenone, 3,4-diaminobenzophenone, 3,3'-diaminodiphenylether, 3,3'-diaminodiphenylmethane, 3,4'-diaminodiphenylmethane, 2,2'-diamino-1,2-diphenylethane, 4,4'-diamino-1,2-diphenylethane, 2,4-diaminodiphenylamine, 4,4'-diaminooctafluorobiphenyl, o-dianisidine, and the like.

The amine curing agent may be present in an amount of about 1 to 15 wt %, or, for example, 1 to 10 wt %, or, for example, about 3 to 7 wt % based on the total amount of the adhesive composition in terms of solid content. Within this range, void (Vc) decrease effects may be obtained.

In an implementation, a ratio between the phenolic curing agent and the amine curing agent may be 3:1 to 1:11. Within this range, voids after molding (Vm) may be minimized. For example, the ratio between the phenolic curing agent and the amine curing agent may be 1:1 to 1:5.

Curing Accelerator

As the curing accelerator, at least one selected from the group of melamine, imidazole, and phosphorus catalysts may be used. For example, phosphorus catalysts may be used. Typically, the phosphorus catalysts may not attack the amine curing agent.

As the phosphorus catalysts, phosphine catalysts may be used, for example TPP, TBP, TMTP, TPTP, TPAP, TPPO, DPPE, DPPP, and DPPB (HOKKO Chemical Industries Co., Ltd.).

In one implementation, the curing accelerator may have a different reaction temperature range than the amine curing agent. The curing accelerator may have a melting point of 90 to 320° C., or, for example, 100 to 200° C., or, for example 120 to 160° C. Within this range, two separate curing periods may be obtained.

The curing accelerator may be present in an amount of about 0.01 to 10 wt %, or, for example, about 0.5 to 7 wt % based on the total amount of the adhesive composition in terms of solid content. Within this range, excellent heat resistance may be exhibited, a drastic reaction of the epoxy resin may not occur, and excellent fluidity and connectivity may be obtained.

Silane Coupling Agent

The adhesive composition may further include a silane coupling agent.

The silane coupling agent may act as an adhesion enhancing agent for enhancing adhesive strength due to a chemical bond between an organic material and an inorganic material, such as fillers.

Any suitable silane coupling agent in the art may be used, for example, epoxy group-containing silane coupling agents, such as 2-(3,4-epoxycyclohexyl)-ethyltrimethoxysilane, 3-glycidoxytrimethoxysilane, or 3-glycidoxypropyltriethoxysilane; amine group-containing silane coupling agents, such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane; mercapto-containing silane coupling agents, such as 3-mercaptopropylmethyldimethoxysilane or 3-mercaptopropyltriethoxysilane; or isocyanate group-containing silane coupling agents, such as 3-isocyanatepropyltriethoxysilane, which may be used alone or in combination thereof.

The coupling agent may be present in an amount of 0 to about 5 wt %, or, for example about 0.1 to 3 wt %, or, for example about 0.5 to 2 wt % based on the total amount of the adhesive composition in terms of solid content. Within this range, excellent bonding reliability may be obtained and a bubbling problem may be suppressed.

Fillers

The adhesive composition may further include a filler. Examples of the filler may include a metal, such as gold, silver, copper, or nickel in powder form; or nonmetals, such as alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, ferrite, ceramics, etc. For example, silica may be used as the filler.

Although the filler is not particularly limited as to shape and size, the filler may be, for example, spherical silica or amorphous silica and may have a size of 5 nm to 20 μm, or, for example, 10 nm to 15 μm.

The filler may be present in an amount of about 10 to 60 wt %, or, for example, about 15 to 40 wt %, or, for example about 20 to 35 wt % based on the total amount of the adhesive composition in terms of solid content. Within this range, excellent fluidity, film formability, and adhesion may be obtained.

Solvent

The adhesive composition may further include a solvent. The solvent may serve to reduce the viscosity of the adhesive composition for the semiconductor and to facilitate film formation. Examples of the solvent may include, for example, organic solvents, such as toluene, xylene, propylene glycol monomethylether acetate, benzene, acetone, methylethylketone, tetrahydrofuran, dimethylformamide, cyclohexanone, or the like.

The adhesive composition for the semiconductor may have a ratio of voids (Vc) of less than 15% and a ratio of voids (Vm) of less than 10% as measured after molding at 175° C. for 60 seconds following one-cycle curing at 150° C. for 30 minutes.

Another aspect provides an adhesive film for a semiconductor formed of the adhesive composition. Particular devices or equipment are not necessary in manufacturing the adhesive film for semiconductor assembly using the adhesive composition. The adhesive film for semiconductor assembly may be formed by any suitable method. For example, the components may be dissolved in a solvent and thoroughly mixed using a bead mill, after which the mixture may be applied to a release-treated polyethylene terephthalate (PET) film using an applicator and dried in an oven at 100° C. for 10 to 30 minutes by heating, thereby producing an adhesive film having a suitable thickness.

In one implementation, the adhesive film for the semiconductor may include a base film, a pressure-sensitive adhesive layer, a bonding layer, and a protective film, which may be sequentially deposited.

The adhesive film may have a thickness of 5 to 200 μm, or, for example, 10 to 100 μm. Within this range, balance between sufficient adhesive strength and cost efficiency may be obtained. For example, the thickness may be 15 to 60 μm.

The adhesive layer and the adhesive film manufactured using the adhesive composition according to embodiments have two separate curing periods, thereby shortening or omitting a semi-curing process that is conducted after bonding the same kind of chips, and minimizing the generation of voids (Vc and Vm).

Another embodiment provides a semiconductor device. FIG. 1 illustrates a sectional view of a semiconductor device according to an embodiment. Referring to FIG. 1, the semiconductor device may include a semiconductor member (200), and an adhesive film (110) on the semiconductor member (200).

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

EXAMPLES

Details of components used in Examples 1 to 8 and Comparative Examples 1 and 2 are described as follows.
(A) Thermoplastic resin: SG-P3 (Nagase Chemtex)
(B1) Epoxy resin: YDCN-500-90P (Kukdo Chemical)
(B2) Epoxy resin: NC-3000 (Nippon Kayaku)
(C) Phenolic curing agent: MEH-7851SS (Meiwa Plastic Industries)
(D) Amine curing agent: DDS (Wako, Equivalent weight: 65)
(E) Acid anhydride curing resin: Phthalic anhydride (Sigma-Aldrich, MP: 130° C.)
(F) Silane coupling agent: KBM-403 (Shinetsu)
(G) Curing accelerator: TPTP (HOKKO Chemical Industries, MP: 146° C.)
(H) Filler: SO-25H, (ADMATECH)
(I) Solvent: Cyclohexanone

TABLE 1

(solid content)

|  | Example 1 | Example 2 | Example 3 | Example 4 | Example 5 | Example 6 | Example 7 | Example 8 |
|---|---|---|---|---|---|---|---|---|
| (A) | 36.9 | 32 | 27 | 32 | 16.0 | 31.4 | 29.9 | 28.6 |
| (B1) | 0 | 0 | 0 | 10 | 0.0 | 0.0 | 0.0 | 0.0 |
| (B2) | 20 | 20 | 20 | 10 | 24.7 | 19.6 | 18.7 | 17.9 |
| (C) | 3 | 3 | 3 | 3 | 3.7 | 4.9 | 9.3 | 13.4 |
| (D) | 5 | 5 | 5 | 5 | 6.2 | 4.9 | 4.7 | 4.5 |
| (E) | 0 | 0 | 0 | 0 | 0 | 0 | 0 | 0 |
| (F) | 1 | 1 | 1 | 1 | 1.2 | 1.0 | 0.9 | 0.9 |
| (G) | 0.1 | 5 | 10 | 5 | 6.2 | 4.9 | 4.7 | 4.5 |
| (H) | 34 | 34 | 34 | 34 | 42.0 | 33.3 | 31.8 | 30.2 |

TABLE 2

(solid content)

|  | Comparative Example 1 | Comparative Example 2 |
|---|---|---|
| (A) | 37 | 32 |
| (B1) | 0 | 0 |
| (B2) | 20 | 20 |
| (C) | 3 | — |
| (D) | 5 | 5 |
| (E) | — | 3 |
| (F) | 1 | 1 |
| (G) | 0 | 0 |
| (H) | 34 | 34 |

Preparation of Adhesive Film

Components listed in Tables 1 and 2 were added to a solvent (I: cyclohexanone), the solution having a solid content of 40%, and thoroughly mixed using a bead mill, after which the mixture was applied to a release-treated PET film using an applicator and dried in an oven at 100° C. for 10 to 30 minutes by heating, thereby producing an adhesive film having a thickness of 60 μm.

The adhesive films manufactured in Examples 1 to 8 and Comparative Examples 1 and 2 were tested as follows, and results are shown in Tables 5 and 6.

(1) Amount of Exothermic Heat During Curing

The amount of exothermic heat generated during curing of each prepared adhesive composition was measured using DSC. Temperature was increased at a rate of 10° C./min and measurement was conducted from 0 to 350° C.

(2) Ratio of Vm Area

A ground wafer was placed on a mounter hot plate, impurities were eliminated with isopropyl alcohol (IPA), and each prepared adhesive film was mounted on a mirror side of the wafer. H-ere, a mounter setting temperature was an actual surface temperature of 60° C.

Then, the adhesive film and the wafer were sawed into 10 mm×10 mm chips, and the chips having the adhesive formed on one side (adhesive+chip) were attached at 120° C. and 1 kgf/sec to a PCB and preliminarily treated under the conditions listed in Table 3, thereby preparing a sample.

TABLE 3

PCB: 62 mm one shot PCB
PCB baking: in oven at 120° C. for 1 hour
Plasma treatment after baking The sample was subjected to 1-cycle curing on a hot plate at 150° C. for 30 minutes and then to EMC molding under the conditions listed in Table 4 for curing, followed by measurement of voids.

TABLE 4

| Mold temperature | Clamp pressure | Transfer pressure | Transfer time | Cure time |
|---|---|---|---|---|
| 175° C. | 30 ton | 1.1 ton | 18 sec | 60 sec |

EMC tablet: EMC SG-8500BC, Cheil Industries

Then, the sample was separated into individual units using a singulation saw, the PCB was removed in order to measure Vm, and grinding was conducted using a grinder to expose the adhesive layer of the adhesive film. Here, grinding was carried out only until a solder resist (SR) layer of the PCB slightly remained to be semi-transparent in order to facilitate observation of voids.

After grinding, a micrograph of the exposed adhesive layer was taken (magnification: ×25) and analyzed to examine whether voids were present. To numerically express voids, a lattice count method was used. The total area was divided into 10×10 sections, and sections having a void were counted and expressed as a percent (Vm area ratio). When a ratio of Vm was less than 10%, it was determined as void elimination. When a ratio of Vm is 10% or more, it was determined as void non-elimination.

$$Vm \text{ area ratio} = \text{Void area}/\text{Total area} \times 100$$

(3) Ratio of Vc Area

Each adhesive composition was formed to a thickness of 50 to 60 μm such that less than 1% of the solvent remained, followed by lamination between two 10 mm×10 mm glass slides at 60° C. and curing on a hot plate at 150° C. for 30 minutes. A micrograph of the adhesive layer was taken (magnification: ×25) and analyzed to numerically express the area of voids with respect to the total measured area.

$$Vc \text{ area ratio} = \text{Void area}/\text{Total area} \times 100$$

(4) Die Creeping after 1-Cycle Curing and then Molding

Each sample was prepared in the same manner as in the measurement process (2) and subjected to EMC molding, followed by examination as to whether creeping occurred, using scanning acoustic tomography (SAT). When the sample moved 10% or more from an initial attachment position, creeping was determined.

(5) Die Shear Strength

A 530 μm thick wafer coated with a dioxide film was cut into 5 mm×5 mm chips. The chips were each laminated with an adhesive film at 60° C. The laminate was cut to leave behind a bonded portion only. A 5 mm×5 mm upper chip was attached to a 10 mm×10 mm alloy 42 lead frame by applying a force of 1 kgf for 1 second on a hot plate at 120° C., followed by a curing process consisting of curing in an oven at 125° C. for 60 minutes, curing on a hot plate at 150° C. for 30 minutes and curing at 175° C. for 2 hours. The specimen was allowed to absorb moisture at 85° C./85% RH for 168 hours, and reflowing was performed three times at a maximum temperature of 260° C. Then, die shear strength was measured at 250° C. using DSC equipment (DAGE 4000).

(6) Reflow Resistance Test

Each sample was prepared in the same manner as in the measurement process (2) and subjected to EMC molding and curing (in an oven at 175° C. for 2 hours). The sample was left to absorb moisture at 85° C./85% RH for 168 hours, and reflowing was conducted three times at a maximum of 260° C., followed by observation of the sample to investigate whether cracks appeared.

TABLE 5

| | Example | | | | | | | |
|---|---|---|---|---|---|---|---|---|
| | 1 | 2 | 3 | 4 | 5 | 6 | 7 | 8 |
| Exothermic range in curing (Number of peaks in curing) | two | two | two | two | two | two | two | two |
| Exothermic range and amount of generated heat in curing (Temperature range of $1^{st}$ peak) | 120° C.~185° C. 30 J/g | 100° C.~165° C. 30 J/g | 70° C.~155° C. 30 J/g | 90° C.~165° C. 40 J/g | 95° C.~165° C. 50 J/g | 100° C.~165° C. 35 J/g | 70° C.~155° C. 40 J/g | 65° C.~155° C. 50 J/g |
| Exothermic range and amount of generated heat in curing (Temperature range of $2^{nd}$ peak) | 185° C.~350° C. 60 J/g | 165° C.~350° C. 60 J/g | 155° C.~350° C. 60 J/g | 165° C.~350° C. 70 J/g | 165° C.~350° C. 80 J/g | 165° C.~350° C. 60 J/g | 155° C.~350° C. 60 J/g | 155° C.~350° C. 60 J/g |
| Area ratio of Vc (%) | 0.9 | 3.8 | 6.8 | 2.1 | 15 | 11.7 | 14.9 | 14.5 |
| Vm | Eliminated | Eliminated | Eliminated | Eliminated | Eliminated | Eliminated | Eliminated | Eliminated |
| Die creeping after 1-cycle curing and then molding | No creeping | No creeping | No creeping | No creeping | No creeping | No creeping | No creeping | No creeping |
| Die shear after reflowing (kgf/chip) | 12 | 14.3 | 17.8 | 20.1 | 16.8 | 16.6 | 17.8 | 18.2 |
| Reflow resistance test (Crack occurrence) | No Crack | No Crack | No Crack | No Crack | No Crack | No Crack | No Crack | No Crack |

No: No occurrence

TABLE 6

|  | Comparative Example 1 | Comparative Example 2 |
|---|---|---|
| Exothermic range in curing (Number of peaks in curing) | 1 | 1 |
| Exothermic range and amount of generated heat in curing (Temperature range of 1st peak) | 65° C.~185° C. 0 J/g | 65° C.~185° C. 0 J/g |
| Exothermic range and amount of generated heat in curing (Temperature range of 2nd peak) | 185° C.~350° C. 60 J/g | 185° C.~350° C. 60 J/g |
| Area ratio of Vc (%) | 23.5 | 25.8 |
| Vm | Not eliminated | Not eliminated |
| Die creeping after 1-cycle curing and then molding | creeping occurred | creeping occurred |
| Die shear after reflowing (kgf/chip) | 5.6 | 6.3 |
| Reflow resistance test (Crack occurrence) | Crack occurred | Crack occurred |

As shown in Tables 5 and 6, the adhesive films according to Examples 1 to 8 have a first exothermic peak between 65 and 185° C., a second exothermic peak between 155 and 350° C., an area ratio of Vc of less than 15%, and Vm was eliminated. Meanwhile, the adhesive films according to Comparative Examples 1 and 2 have one exothermic peak between 65 and 350° C., a remarkably high area ratio of Vc, and involve cracks as a result of the reflow resistance test.

Details of components used in Examples 9 to 16 and Comparative Examples 3 to 6 are described as follows.

(A) Thermoplastic resin: SG-P3 (Nagase Chemtex)
(B3) Epoxy resin: EPPN-501H (Nippon Kayaku)
(B4) Epoxy resin: YDCN-500-1P (Kukdo Chemical)
(C1) Phenolic curing agent: HF-1M (Meiwa Plastic Industries, Equivalent weight: 106)
(C2) Phenolic curing agent: MEH-78004S (Meiwa Plastic Industries, Equivalent weight: 204)
(D) Amine curing agent: DDS (Wako, Equivalent weight: 65)
(E) Acid anhydride curing resin: Phthalic anhydride (Sigma-Aldrich, MP: 130° C.)
(F) Silane coupling agent: KBM-403 (Shinetsu)
(G) Curing accelerator: TPP-K (HOKKO Chemical Industries)
(H) Filler: SO-25H, (ADMATECH)
(I) Solvent: Cyclohexanone

TABLE 7

| (solid content) | | | | | | | | |
|---|---|---|---|---|---|---|---|---|
|  | Example | | | | | | | |
|  | 9 | 10 | 11 | 12 | 13 | 14 | 15 | 16 |
| (A) | 36.9 | 32 | 59.5 | 32 | 32 | 32 | 32 | 36.9 |
| (B3) | 20 | 20 | 11.9 | 10 | 20 | 20 | 10 | 20 |
| (B4) | 0 | 0 | 0 | 10 | 0 | 0 | 10 | 0 |
| (C1) | 3 | 3 | 1.8 | 3 | 1.5 | 3 | 1.5 | 3 |
| (C2) | 0 | 0 | 0 | 0 | 1.5 | 0 | 1.5 | 0 |
| (D) | 5 | 5 | 3.0 | 5 | 5 | 5 | 5 | 5 |
| (E) | 0 | 0 | 0 | 0 | 0 | 0 | 0 | 0 |
| (F) | 1 | 1 | 0.6 | 1 | 1 | 1 | 1 | 1 |
| (G) | 0.1 | 5 | 3.0 | 5 | 5 | 5 | 5 | 0.1 |
| (H) | 34 | 34 | 20.2 | 34 | 34 | 34 | 34 | 34 |

TABLE 8

| (solid content) | | | | |
|---|---|---|---|---|
|  | Comparative Example | | | |
|  | 3 | 4 | 5 | 6 |
| (A) | 37 | 61.4 | 36.9 | 36.9 |
| (B3) | 20 | 12.3 | 20 | 20 |
| (B4) | 0 | 0 | 0 | 0 |
| (C1) | 3 | 1.8 | 0 | 0 |
| (C2) | 0 | 0 | 0 | 0 |
| (D) | 5 | 3.1 | 8 | 3 |
| (E) | 0 | 0 | 0 | 5 |
| (F) | 1 | 0.6 | 1 | 1 |
| (G) | 0 | 0 | 0.1 | 0.1 |
| (H) | 34 | 20.9 | 34 | 34 |

Adhesive films were prepared in the same manner as in Examples 1 to 8. The adhesive films were tested as to compressive strength as follows and evaluated as to voids after 1 cycle, voids after molding following 1 cycle, die creeping after molding following 1 cycle, die shear strength and a reflow resistance test, and results are shown in Tables 9 and 10.

Compressive Strength

Each adhesive composition was formed into a laminate having a thickness of 400 μm, which was placed between release-treated PET films and cured in an oven at 125° C. for 30 minutes. Then, the product was pressed at 150° C. and 0.1 mm/sec using ARES and measured as to strength at a pressed distance of 0.05 mm.

TABLE 9

| | Example | | | | | | | |
|---|---|---|---|---|---|---|---|---|
|  | 9 | 10 | 11 | 12 | 13 | 14 | 15 | 16 |
| Compressive strength (gf/mm$^2$) | 600 g | 751 g | 952 g | 756 g | 897 g | 675 g | 554 g | 1495 g |
| Area ratio of Vc (%) | 4.3 | 3.2 | 0.5 | 1.2 | 0.3 | 5.1 | 14.7 | 0.1 |
| Vm | Eliminated | Eliminated | Eliminated | Eliminated | Eliminated | Eliminated | Eliminated | Eliminated |
| Die creeping after molding following 1 cycle | No creeping | No creeping | No creeping | No creeping | No creeping | No creeping | No creeping | No creeping |
| Die shear after reflowing (kgf/chip) | 12 | 14.3 | 16.8 | 15.2 | 14.3 | 16.6 | 17.8 | 18.2 |
| Reflow resistance test (Crack occurrence) | No Crack | No Crack | No Crack | No Crack | No Crack | No Crack | No Crack | No Crack |

No: No occurrence

TABLE 10

|  | Comparative Example | | | |
|---|---|---|---|---|
| Cure cycle | 3 | 4 | 5 | 6 |
| Compressive strength (gf/mm$^2$) | 44 | 32 | 67 | 48 |
| Area ratio of Vc (%) | 25.5 | 32.1 | 19.3 | 25.5 |
| Vm | Not eliminated | Not eliminated | Not eliminated | Not eliminated |
| Die creeping after molding following 1 cycle | creeping occurred | creeping occurred | creeping occurred | creeping occurred |
| Die shear after reflowing (kgf/chip) | 5.1 | 6.5 | 5.1 | 5.1 |
| Reflow resistance test (Crack occurrence) | Crack Occurred | Crack Occurred | Crack Occurred | Crack Occurred |

As shown in Tables 9 and 10, the adhesive films according to Examples 9 to 16 have a compressive strength of 100 to 1,500 gf/mm$^2$ and voids after molding were eliminated. However, the adhesive films according to Comparative Examples 3 to 6 have a remarkably high area ratio of Vc and suffered cracks as a result of the reflow resistance test.

By way of summation and review, to realize a semiconductor device having a high capacity, a qualitative high-integration method of increasing the number of cells per unit area and a quantitative packaging method of depositing a plurality of chips to increase capacity are used. As a packaging method, multi-chip packaging (MCP) is generally used, in which a plurality of chips are deposited using adhesives and upper and lower chips are electrically connected to each other using wire bonding.

In depositing semiconductor package chips, when the same size of chips are mounted vertically, a spacer is conventionally attached in advance to secure a space for a bonding wire, which may cause inconvenience because an additional process is used for attaching the spacer. A lower bonding wire may be accommodated directly in an adhesive film attached to a lower side of an upper chip in order to simplify the process. In such as case, the adhesive layer should have sufficient fluidity for the bonding wire to pass therethrough at a chip bonding temperature of about 100 to 150° C. If the adhesive layer has insufficient fluidity, quality defects, such as wire collapse or compression, may occur.

Accordingly, high-fluidity adhesives have been introduced to address the less than desirable accommodation of the bonding wire by low-fluidity adhesives. However, a high-fluidity adhesive layer may create an uneven adherend, since chips may be bent in a chip bonding process due to excessive adhesive performance by the high-fluidity adhesive. Also, if an adherend substrate has uneven parts on the surface thereof, voids may be formed on the interface between the adhesive layer and the substrate. Once formed, the voids are not removed but may settle during the adhesive curing or epoxy molding (EMC molding) process, thereby causing defects in a semiconductor chip package and decreased reliability under severe conditions. Accordingly, a semi-curing process after bonding the same kind of chips has been suggested. However, such method may be inconvenient due to additional process and reduces productivity.

Embodiments provide an adhesive composition for a semiconductor that may allow shortening or omission of a semi-curing process after chip bonding, and may provide a remaining curing rate after various processes subsequent to chip bonding, thereby facilitating elimination of voids in EMC molding.

When a semi-curing process is shortened or omitted after attaching a chip, to which an adhesive composition according to embodiments is bonded, to a substrate or a chip, voids may be eliminated or minimally generated. Further, a remaining curing rate may be provided after various processes subsequent to die bonding, such as wire bonding and EMC molding, to efficiently eliminate voids in EMC molding. Voids that may be generated in a semiconductor manufacture process (die attaching and molding) may be effectively removed, thereby improving processability and reliability.

Further, the adhesive composition according to embodiments may not undergo bending when depositing chips, thereby enabling multistory chip deposition, and the adhesive composition according to embodiments may have a sufficient compressive strength so that chips are not easily moved in wiring bonding. Thus, the adhesive composition may be applied to film-on wire (FOW) processes that require penetration properties of a bonding wire. The adhesive composition according to embodiments may have void eliminating properties in EMC molding, thereby obtaining both processability and reliability in bonding the same kinds of chips, in which the adhesive film may include the bonding wire. Further, embodiments relate to an adhesive film including the adhesive composition for the semiconductor.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. An adhesive composition for a semiconductor, the adhesive composition having two exothermic peaks between 65° C. and 350° C. and having an area ratio of voids (Vm) of less than 10%, measured after 1-cycle curing at 150° C. for 30 minutes and then molding at 175° C. for 60 seconds,
   wherein a first exothermic peak appears between 65° C. and 185° C. and a second exothermic peak appears between 155° C. and 350° C. with the proviso that the second exothermic peak appears at a higher temperature than the first exothermic peak,
   wherein the adhesive composition includes a thermoplastic resin; an epoxy resin; a curing agent; and a curing accelerator, and
   wherein the curing agent includes a phenolic curing agent and an amine curing agent.

2. The adhesive composition as claimed in claim 1, wherein the phenolic and amine curing agents each have a different reaction temperature range.

3. The adhesive composition as claimed in claim 1, wherein the phenolic curing agent is represented by Formula 1:

[Formula 1]

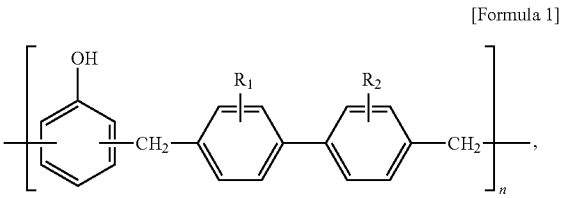

where $R_1$ and $R_2$ in Formula 1 each independently represent a C1 to C6 alkyl group, and n is from 2 to 100.

4. The adhesive composition as claimed in claim 1, wherein the amine curing agent is represented by Formula 2:

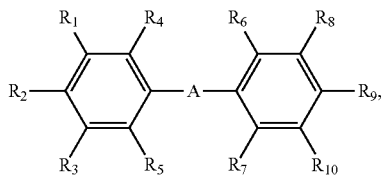

[Formula 2]

wherein A in Formula 2 is a single bond or represents one selected from the group of —$CH_2$—, —$CH_2CH_2$—, —$SO_2$—, —NHCO—, —$C(CH_3)_2$—, and —O—, and $R_1$, $R_2$, $R_3$, $R_4$, $R_5$, $R_6$, $R_7$, $R_8$, $R_9$ and $R_{10}$ in Formula 2 each independently represent hydrogen, a C1 to C4 alkyl group, a C1 to C4 alkoxy group, or an amine group; here, at least two of $R_1$, $R_2$, $R_3$, $R_4$, $R_5$, $R_6$, $R_7$, $R_8$, $R_9$ and $R_{10}$ in Formula 2 include amine groups.

5. The adhesive composition as claimed in claim 1, wherein a ratio of the phenolic curing agent to the amine curing agent is 3:1 to 1:11.

6. The adhesive composition as claimed in claim 1, wherein the curing accelerator has a melting point of 100° C. to 160° C.

7. The adhesive composition as claimed in claim 1, wherein the adhesive composition includes 15 to 70 wt % of the thermoplastic resin, 5 to 35 wt % of the epoxy resin, 0.5 to 15 wt % of the phenolic curing agent, 1 to 15 wt % of the amine curing agent, 0.01 to 10 wt % of the curing accelerator, 0 to 5 wt % of a silane coupling agent, and 10 to 60 wt % of fillers.

8. The adhesive composition as claimed in claim 1, wherein:
an amount of the thermoplastic resin is greater than a total amount of the epoxy resin and the curing agent, and
a ratio of the phenolic curing agent to the amine curing agent is 1:1 to 1:5.

9. The adhesive composition as claimed in claim 1, wherein:
an amount of the thermoplastic resin is less than a total amount of the epoxy resin and the curing agent, and
a ratio between a phenolic curing agent and an amine curing agent is 1:1 to 1:5.

10. The adhesive composition as claimed in claim 1, wherein the adhesive composition has an area ratio of voids Vc of less than 15% after 1-cycle curing at 150° C. for 30 minutes.

11. An adhesive film for a semiconductor, the adhesive film including the adhesive composition as claimed in claim 1.

12. A semiconductor device including the adhesive film as claimed in claim 11.

13. An adhesive composition for a semiconductor, the adhesive composition having a compressive strength of 100 to 1,500 gf/mm² at 150° C. after curing at 125° C. for 30 minutes and an area ratio of voids (Vm) on an adherend of less than 10% after 1-cycle curing at 150° C. for 30 minutes and then EMC molding at 175° C. for 60 seconds.

14. The adhesive composition as claimed in claim 13, wherein the adhesive composition has an area ratio of voids Vc of less than 15% after 1-cycle curing at 150° C. for 30 minutes.

15. An adhesive film for a semiconductor, the adhesive film comprising the adhesive composition as claimed in claim 13.

16. An adhesive composition for a semiconductor, the adhesive composition having a compressive strength of 100 to 1,500 gf/mm² at 150° C. after curing at 125° C. for 30 minutes and an area ratio of voids (Vc) on an adherend of less than 15% after 1-cycle curing at 150° C. for 30 minutes.

17. An adhesive film for a semiconductor, the adhesive film comprising the adhesive composition as claimed in claim 16.

18. A semiconductor device comprising the adhesive film as claimed in claim 17.

* * * * *